United States Patent [19]
Choi et al.

[11] Patent Number: 5,877,669
[45] Date of Patent: Mar. 2, 1999

[54] FLYBACK TRANSFORMER HAVING A FLEXIBLE COIL WINDING STRUCTURE AND MANUFACTURING PROCESS THEREOF

[75] Inventors: Chang-Gu Choi, Taejon; Ha-Eun Nam, Seoul, both of Rep. of Korea

[73] Assignee: Daewoo Electronics Co., Ltd., Seoul, Rep. of Korea

[21] Appl. No.: 755,611

[22] Filed: Nov. 25, 1996

[30] Foreign Application Priority Data

| Nov. 30, 1995 | [KR] | Rep. of Korea | 95-69126 |
| Nov. 30, 1995 | [KR] | Rep. of Korea | 95-69127 |
| Dec. 31, 1995 | [KR] | Rep. of Korea | 95-72213 |

[51] Int. Cl.$^6$ .............................. H01F 5/00; H01F 27/28
[52] U.S. Cl. ............................................. 336/200; 336/232
[58] Field of Search ............................. 336/20, 200, 180, 336/183, 232

[56] References Cited

U.S. PATENT DOCUMENTS

| 4,308,513 | 12/1981 | Layton et al. | 336/200 |
| 5,237,165 | 8/1993 | Tingley, III | 336/200 |
| 5,241,293 | 8/1993 | Okumura | 336/200 |
| 5,381,124 | 1/1995 | Roshen | 336/200 |
| 5,392,020 | 2/1995 | Chang | 336/200 |
| 5,425,167 | 6/1995 | Shiga et al. | 336/200 |
| 5,461,353 | 10/1995 | Eberhardt | 336/200 |
| 5,487,214 | 1/1996 | Walters | 336/200 |
| 5,514,832 | 5/1996 | Dusablon, Sr. et al. | 336/200 |
| 5,572,180 | 11/1996 | Huang et al. | 336/200 |
| 5,576,680 | 11/1996 | Ling | 336/200 |
| 5,598,136 | 1/1997 | Kano et al. | 336/200 |
| 5,610,569 | 3/1997 | Hwang et al. | 336/200 |

FOREIGN PATENT DOCUMENTS

| 0 011 013 | 5/1980 | European Pat. Off. . |
| 1126370 | 9/1968 | United Kingdom . |
| 1216905 | 12/1970 | United Kingdom . |
| 1279160 | 6/1972 | United Kingdom . |
| WO94/14174 | 6/1994 | WIPO . |

*Primary Examiner*—Lincoln Donovan
*Assistant Examiner*—Anh Mai
*Attorney, Agent, or Firm*—Beveridge, DeGrandi Weilacher & Young LLP

[57] ABSTRACT

A flexible coil winding structure of a flyback transformer is disclosed, which comprises a magnetizable core at the center portion, a pair of flexible insulator sheets at both sides of the magnetizable core for insulating it, and first and second conductor line patterns arranged so that they can provide a coiled circuit pattern around the pair of flexible insulator sheets. The first and second conductor line patterns include respectively a plurality of first and second parallel conductor lines which are inclined at a predetermined angle. Also, the coil winding structure includes an opening, such as an etched hole or a window, etc., at a portion of the insulator sheet which corresponds to the upper and lower portions of all the conductor lines and an electrical connection for connecting through the opening the upper portions and the lower portions of the first and second conductor line patterns so that the conductor lines provide the coiled circuit pattern. The electrical connection is provided by soldering. A manufacturing process of the flexible coil winding structure is also disclosed.

46 Claims, 10 Drawing Sheets

FLYBACK TRANSFORMER HAVING A FLEXIBLE COIL WINDING STRUCTURE AND MANUFACTURING PROCESS THEREOF

BACKGROUND OF THE INVENTION

1. Field of the Invention

The present invention relates to a flyback transformer, and more particularly, to a flyback transformer having a flexible coil winding structure in a planar shape and a manufacturing process thereof.

2. Description of the Prior Art

Generally, a flyback transformer (hereinafter, referred to as "FBT") is employed as a device for generating high voltage in TV receivers, oscilloscopes and CRTs, etc. This FBT basically includes a primary coil winding and a secondary coil winding, which are electromagnetically interconnected by a magnetizable core. The value of the generated voltage depends on the ratio of the number of turns of the secondary winding to that of the primary winding. In case of the conventional FBT for generating higher voltages, a greater number of turns of the secondary winding has been required, which has resulted in an increase in the volume thereof, and consequently lead to poor efficiency and also poor high voltage regulation.

To solve the above problems, U.S. Pat. No. 5,392,020 issued on Feb. 21, 1995 to Kern K. N. Chang describes a flexible transformer apparatus as illustrated in FIGS. 1A to 1D, which will be explained below.

FIG. 1A is a perspective view schematically illustrating the configuration of the flexible transformer apparatus. As illustrated in the figure, the flexible transformer apparatus includes a pair of planar sheets 10, 20 and a magnetizable sheet 30 interposed between them. The planar sheets 10, 20 consist of respectively an insulator sheet and a plurality of conductor lines 12, 14 and 22, 24 vapor-deposited thereon. The conductor lines 12, 14 and 22, 24 are connected with each other in a zigzag formation to form a secondary coil winding.

FIGS. 1B and 1C are plan views illustrating the planar sheets 10, 20 of FIG. 1A. As shown in the figures, the first planar sheet 10 and the second planar sheet 20 include the parallel conductor lines 12, 14 and 22, 24 respectively. The parallel conductor lines 12, 24 and 22, 24 are inclined at a predetermined angle and arranged at longitudinally interspaced distances. These configured parallel conductor lines are interconnected so as to form the flexible transformer apparatus, as illustrated in FIG. 1A.

The parallel conductive lines 12, 14 and 22, 24 may be formed on the surface of the insulator sheet by conventional vapor deposition techniques, RF sputtering techniques, etc., using photolithographic procedures. The materials used for the conductor lines are noble metals such as platinum, gold, silver, copper, aluminum and their alloys.

FIG. 1D is a transverse sectional view of the flexible transformer apparatus of FIG. 1A, which illustrates the electrically connected configuration of the conductor lines 12, 14 and 22, 24 on the planar sheets 10, 20. With regard to the electrical connection of the conductor lines, the patent describes as follows: Each of the conductor lines is provided with apertures 12a, 12b, 14a, 14b and 22a, 22b, 24a, 24b formed at both ends thereof, and connecting rods 40 are inserted into the apertures to thereby provide the electrical connection between the conductor lines of the first planar sheet and those of the second one.

In the above-described flexible transformer apparatus, however, it is understood that the secondary windings require about 4,000 turns of coil winding, and the conductor lines have a width of from 40 to 125 microns. Therefore, it is not possible actually to form the apertures at both ends of those very fine conductor lines, and also insert mechanically the connecting rod into these fine apertures one by one for achieving the electrical connection between the conductor lines. Furthermore, this mechanical connection practice is not adaptable for substantial production, especially mass production of the above flexible transformer apparatus.

SUMMARY OF THE INVENTION

Accordingly it is an object of the invention to provide a new flexible coil winding structure of a flyback transformer for achieving a greater number of turns of coil winding.

It is another object of the invention to provide a manufacturing process which is readily adaptable for the mass production of the flexible coil winding structure.

To achieve the objects of the invention, there is provided a process for manufacturing a flexible coil winding structure of a flyback transformer, which comprises the steps of:

a) forming a thin conductive layer on a thin insulator sheet to obtain a flexible laminated sheet member;

b) removing partly the conductive layer from the flexible laminated sheet member to obtain a first conductor line pattern sheet member including a first conductor line pattern, the first conductor line pattern having a plurality of first parallel conductor lines which are inclined at a predetermined angle;

c) removing partly the conductive layer from the flexible laminated sheet member to obtain a second conductor line pattern sheet member including a second conductor line pattern, the second conductor line pattern having a plurality of second parallel conductor lines which are inclined at the same angle as in the first conductor line pattern;

d) connecting the upper portions and the lower portions of the first conductor lines with the lower portions and upper portions of the second conductor lines to obtain a coil pattern laminated sheet member including a coiled circuit pattern, whereby the coiled circuit pattern is formed by the first conductor line pattern and the second conductor line pattern; and e) inserting a magnetizable core into the coil pattern laminated sheet member.

Preferably, the insulator sheet has a thickness of less than about 35 microns, and the conductive layer has a thickness of from several to about 100 microns, even more preferably of from about 25 to about 75 microns.

The flexible laminated sheet member may be provided by applying an adhesive to the surface of the insulator sheet made from polyimide or polyester, etc., followed by adhering a copper or aluminum film over the adhesive. The flexible laminated sheet member may be also prepared by forming a seed layer of a conductive material such as chromium or nickel on the insulator sheet using RF sputtering technique, etc., and then forming the conductive layer of copper or aluminum over the seed layer using electroplating, electroless plating, vapor deposition or RF sputtering techniques, etc.

Preferably, the first and second conductor line pattern sheet members include a conductor line terminal respectively for inflow or outflow of electric current to or from the coiled circuit pattern, and the conductor line terminals are integrally formed with either the right end or left end conductor line.

The first and second conductor line pattern sheet members may include an align mark for correctly aligning the upper and lower portions of the first and second parallel conductor lines in the connecting step of d). The insulator sheet may be provided with a pair of holes at either the longitudinal right or left end margin, or a plurality of holes in the transverse upper and lower end margin, or various characters and symbols such as a (+) sign, thereby employing those as the align mark.

The connecting step of d) comprises the steps of removing a part of the insulator sheet which corresponds to the upper and lower portions of all the first and second conductor lines to thereby form upper and lower exposed portions in all the first and second conductor lines, folding the first and second conductor line pattern sheet members so that the insulator sheets face to each other, and electrically connecting the exposed portions of the first and second conductor lines with each other so that the first and second conductor line patterns form the coiled circuit pattern.

The step of removing a part of the insulator sheet may be carried out by removing longitudinally a part of the insulator sheet across the upper and lower portions of the conductor lines to thereby form the exposed portions. The electrically connecting step may be carried out by solder-plating the upper and lower exposed portions of the first and second conductor lines, or dipping them into a molten solder, printing a solder cream or paste on the upper and lower exposed portions of the first and second conductor lines, and then hot-pressing for soldering the upper and lower portions of the conductor lines. It is preferable that the hot-pressing is carried out at a temperature of from about 200 to about 280 degrees Celsius.

Alternatively, the step of removing a part of the insulator sheet may also be carried out by etching a part of the insulator sheet which corresponds to the upper and lower portions of the individual conductor lines to thereby form the exposed portions. The electrical connecting step may be carried out by forming on the exposed portions a metallic film of a thickness of 1 to 2 microns, placing solder balls on the exposed portions using a solder ball grid array technique, and hot-pressing for soldering the exposed portions of the conductor lines. The formation of the metallic film may be formed by electroplating, RF sputtering, or vapor-deposition, etc. Preferably, a metallic material such as copper or lead may be employed as the metallic film. It is preferable that the hot-pressing is carried out at a temperature of from about 200 to about 280 degrees Celsius.

The electrically connecting step may be also carried out by forming on the exposed portions a metallic build-up layer up to 10 to 20 microns above the surface of the insulator sheet, applying a solder to the metallic build-up layers as described above, and hot-pressing for soldering the metallic build-up layers.

By carrying out the above several steps of the process of the invention, there is provided a flexible coil winding structure, which includes at the center portion the magnetizable core having a shape of an elongated strip, the flexible insulator sheets at both sides of the magnetizable core for insulating it, and the first and second conductor line patterns arranged so that they can provide the coiled circuit pattern around the pair of flexible insulator sheets. Also, the coil winding structure includes an opening (like the etched holes or the windows, etc.) at a portion of the insulator sheet which corresponds to the upper and lower portions of all the conductor lines of the first and second conductor line patterns and an electrical connection for connecting through the opening the upper portions and the lower portions of the first and second conductor line patterns so that the conductor lines provide the coiled circuit pattern. The electrical connection is provided according to and characterized by various connecting methods of the process as described above.

BRIEF DESCRIPTION OF THE DRAWINGS

The above, other features and advantages of the invention will be apparent from the following detailed description of the preferred embodiments of the invention in conjunction with the following drawings in which.

DETAILED DESCRIPTION OF THE PREFERRED EMBODIMENT

Hereinafter, the invention will be described in further detail by way of several preferred embodiments with reference to the accompanying drawings.

<The first step of the process of the invention>

In the first step of the process, a flexible laminated sheet member is provided by forming a thin conductive layer on the surface of a thin insulator sheet.

Figure 1A:
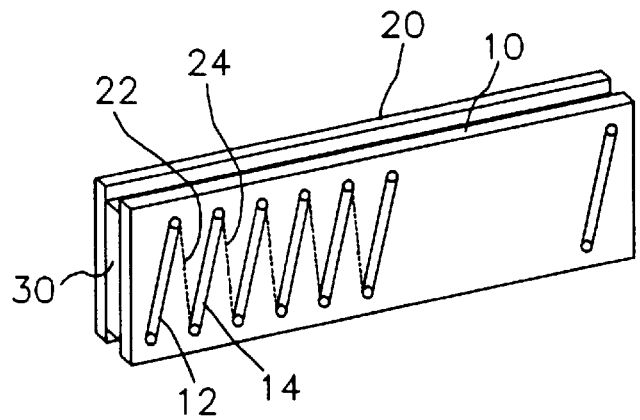
FIG. 1A is a perspective view showing schematically the configuration of a conventional flexible transformer apparatus.
Figure 1B:
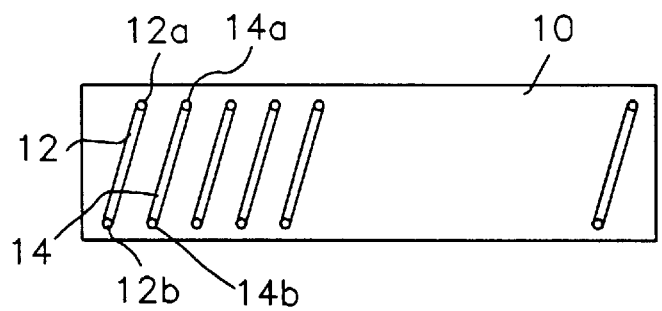
FIG. 1B is a plan view showing a first planar sheet of FIG. 1.
Figure 1C:
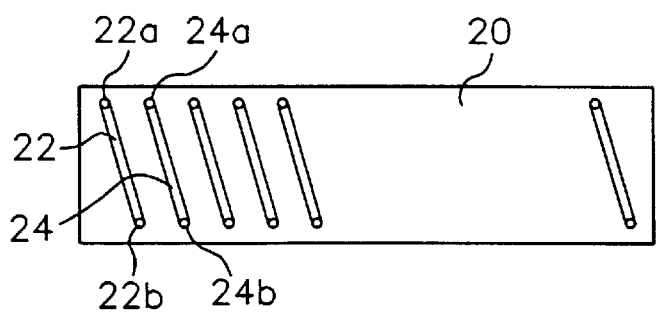
FIG. 1C is a plan view showing a second planar sheet of FIG. 1.
Figure 1D:
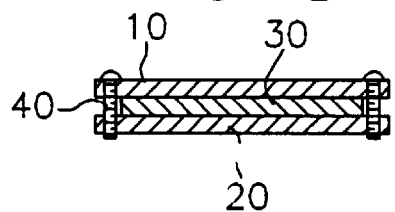
FIG. 1D is a transverse sectional view illustrating the electrically connected configuration of conductor lines in FIG. 1A.
Figure 2:
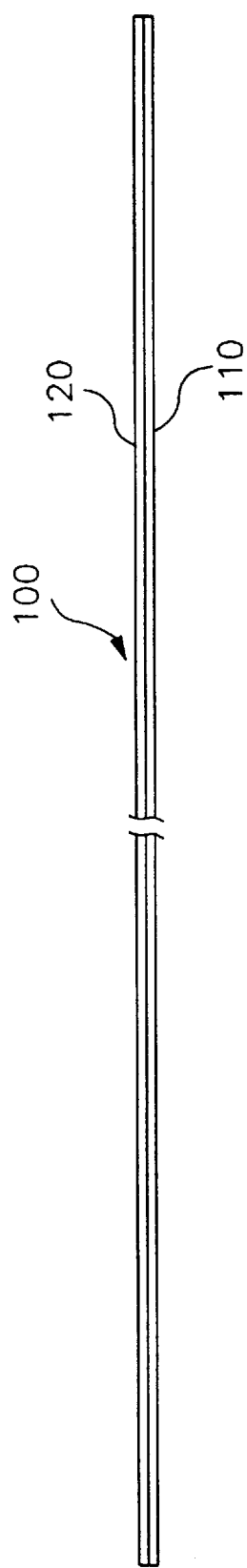
FIG. 2 is a sectional side view showing the layered configuration of a flexible laminated sheet member according to the first step of the invention.

FIG. 2 is a sectional side view illustrating the layered configuration of the flexible laminated sheet member 100, which consists of two layers. In this figure, reference numerals 110 and 120 denote respectively the thin insulator sheet and the thin conductive layer formed on the surface of the insulator sheet.

Preferably, the insulator sheet 110 is made of an insulating substance such as polyimide or polyester, etc., which has good characteristics in heat-resistance and electric insulation. The insulator sheet 110 is preferred to be sufficiently thin enough to preserve its flexibility, and more preferably has a thickness of less than about 35 microns.

The conductive layer 120 may be made of a metallic material such as copper or aluminum, which has good characteristics in electric conductivity and adhesiveness to the insulator sheet 110. Metallic materials such as copper or aluminum do not have a very good adhesiveness to the polyimide or polyester of the insulator sheet 110. Therefore, as one preferred embodiment for easily forming the copper or aluminum layer on the surface of the polyimide or polyester sheet, a seed layer with a thickness of about 50 microns may be formed on the surface of the sheet 110 by using RF sputtering technique, etc., and then a uniform conductive layer 120 may be formed over the seed layer.

Nickel or chromium, etc., may be preferably used as materials for the seed layer. Also the conductive layer of copper or aluminum may be formed by using electroplating, electroless plating, vapor deposition or RF sputtering techniques, etc., on a case by case basis.

Another preferred embodiment for forming the conductive layer 120 of copper or aluminum on the insulator sheet 110 may be carried out by coating or layering an adhesive with a thickness of about 35 microns on the surface of the insulator sheet 100 followed by adhering copper or aluminum foil over the adhesive layer.

Preferably, the conductive layer 120 has a thickness of from several to about 100 microns, more preferably of from about 25 to 75 microns for preserving the electric conductivity thereof and also the flexibility of the overall laminated sheet member 100.

<The second and third steps of the process of the invention>

The second and third steps of the process of the invention will be described in details below.

In the first and second steps of the process, a first and a second conductor line pattern sheet members are prepared by removing partly the conductive layer 120 from the flexible laminated sheet member 100. The first and the second conductor line pattern sheet members include a first and second conductor line patterns respectively, which have a plurality of first and second parallel conductor lines inclined at a predetermined angle.

Figure 3:
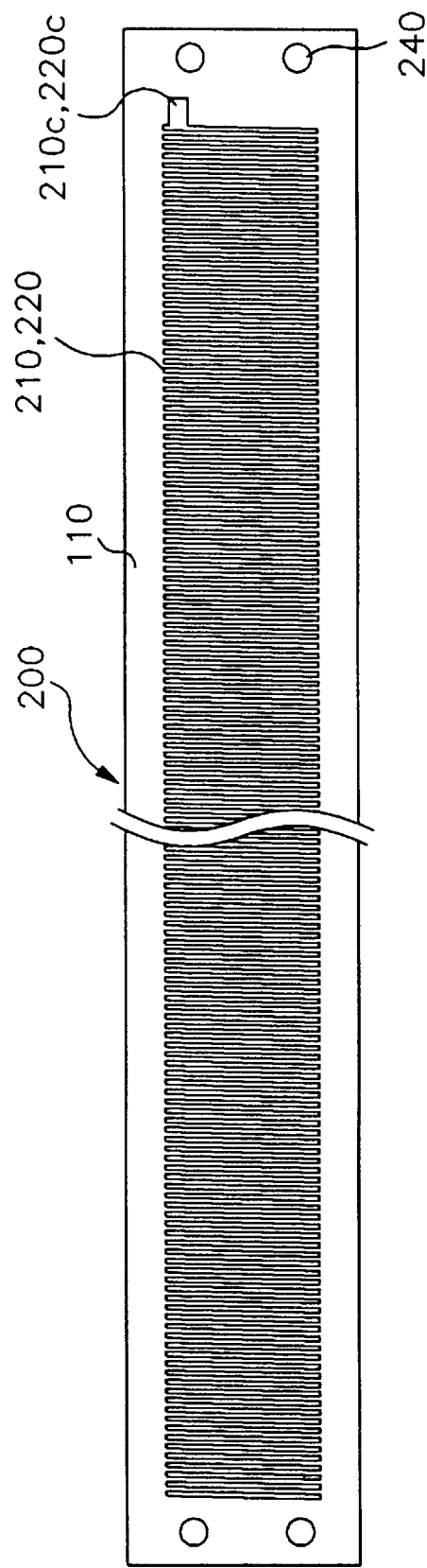
FIG. 3 is a plan view showing the overall configuration of a first or second conductor line pattern sheet member according to the second or third step of the invention process.
Figure 4A:
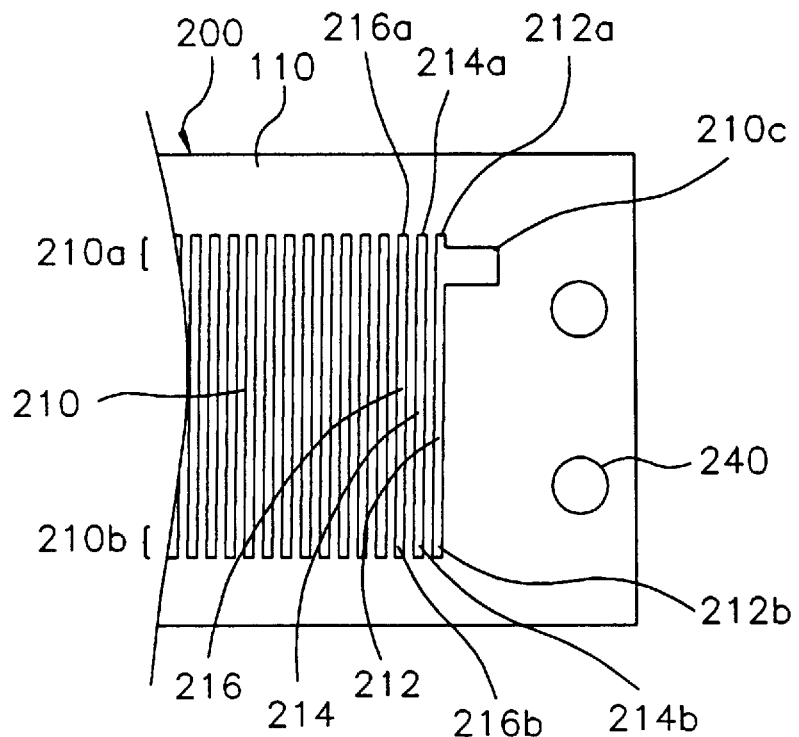
FIG. 4A is an enlarged plan view of the right end portion of the first conductor line pattern sheet member in FIG. 3.
Figure 4B:
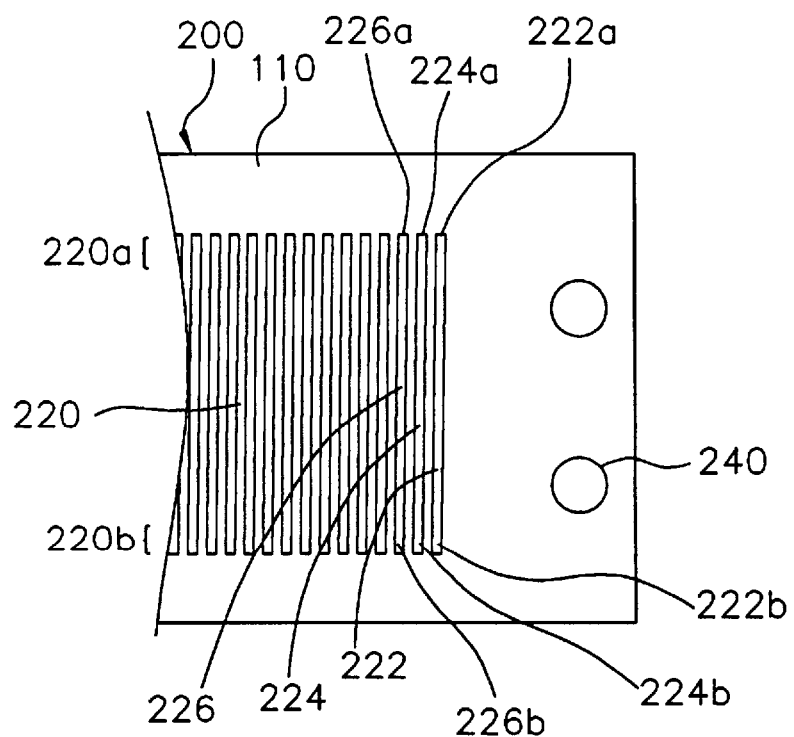
FIG. 4B is an enlarged plan view of the right end portion of the second conductor line pattern sheet member in FIG. 3.

FIGS. 3, 4A and 4B are plan views of the conductor line pattern sheet members 200 manufactured by the second and third steps of the invention. FIG. 3 illustrates the whole outline of the first or second conductor line pattern sheet member 200, and FIGS. 4A and 4B are enlarged plan views of the right end portion in FIG. 3. As matter of convenience, FIG. 4A indicates the first conductor line pattern sheet member, and FIG. 4B indicates the second conductor line pattern sheet member.

As illustrated in FIG. 4A, the first conductor line pattern sheet member 200 includes a first conductor line pattern 210 having a plurality of first parallel conductor lines 212, 214, 216, which are arranged at longitudinal interspaced distances in the insulator sheet 110 and inclined at a predetermined angle. Preferably, the right end conductor line 212 may be provided with a conductor line terminal 210c integrally formed near the upper end of the conductor line 212 for being used as an input or output terminal of electric current. Similarly, the second conductor line pattern sheet member 200 of FIG. 4B includes a second conductor line pattern 220 having a plurality of second parallel conductor lines 222, 224, 226, which are inclined at the same angle as in the first conductor line pattern 210. The left end conductor line may be provided with a second conductor line terminal 220C at the left end conductor line, which is not illustrated in the figures.

The above-configured conductor line pattern sheet members 200 may be manufactured by using a conventional method such as photolithographic techniques and screen printing techniques, etc., which are usually applied to the formation of fine circuits on a printed circuit board, etc. For instance, the manufacturing procedure may be carried out by printing the patterns of conductor lines of FIG. 3 and some other patterns required or helpful to the subsequent steps of process on the surface of the conductive layer 120 of the flexible laminated sheet member 100 in FIG. 2, and removing selectively the non-printed portions from the conductive layer 120, for example by using an aqueous solution of ferric oxide which is able to etch selectively the copper layer but not the insulator sheet 110.

Figure 5:
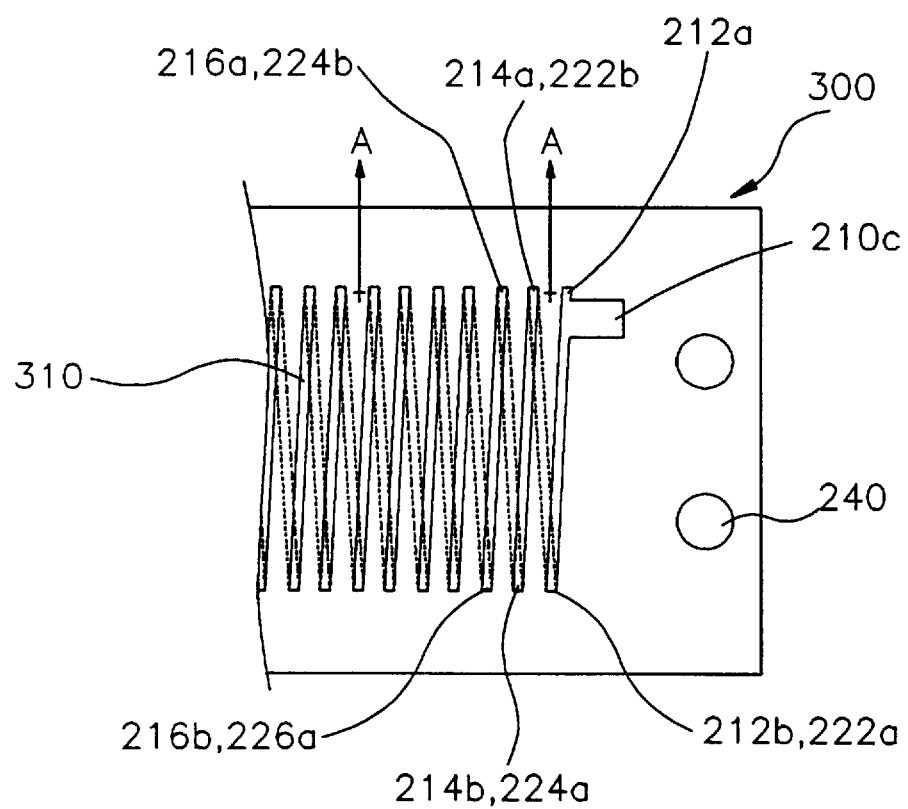
FIG. 5 is a plan view showing the configuration of a coil pattern laminated sheet member according to the fourth step of the invention.

As can be seen in subsequent descriptions about the fourth step of the invention, the conductor lines 212, 214, 216 and 222, 224, 226 should be adjusted in the angle of inclination, width and interdistance thereof so that the first and second conductor line patterns 210, 220 can constitute a coiled circuit pattern 310 of FIG. 5, when the first and second conductor line pattern sheet members 200 are folded. Any skilled persons in the art could determine the angle of inclination, width and interdistance of the conductor lines, depending on the overall size of the conductor line pattern sheet member 200 and/or the conductor line patterns 210, 220.

In this embodiment, it is preferable that the conductor lines 212, 214, 216 and 222, 224, 226 have the inclination angle of from 89.70 to 89.99 degrees, even more preferably 89.91 degrees, the width of from about 40 to 100 microns, and the interdistance of from about 40 to about 100 microns.

In order to facilitate the easy handling of the sheet members over the whole process of the invention, the conductor line patterns 210, 220 may be smaller in width than the insulator sheet 110 so that the conductor line pattern sheet members 200 include some margin at the transverse upper and lower end portions and the longitudinal right and left end portions, as illustrated in FIG. 3. Furthermore, in order to facilitate the correct aligning of the conductor line patterns 210, 220 with each other when they are folded, the conductor line pattern sheet members 200 include several align marks 240 in the margins. As the align mark, the conductor line pattern sheet members 200 may include a pair of marking holes 240 in the right and left margins as illustrated in FIGS. 3, 4A and 4B, or several holes in the transverse upper and lower margins, which holes are not illustrated in figures. Also the align mark may comprise various characters and symbols such as a (+) sign.

Only one pair of the conductor line pattern sheet members 200 is illustrated in FIGS. 4A and 4B, but any persons skilled in the art could conceive of a possible mass production process as follows: preparing a broader rectangular laminated sheet member 100, and printing and etching the desired number of pairs of the conductor line patterns 210, 220 at once.

<The fourth step of the process of the invention>

The fourth step of the process of the invention will be described in details below with reference to FIG. 5.

In the fourth step of the process, a coil pattern laminated sheet member is provided by electrically connecting the upper and lower portions of the first conductor lines to the lower and upper portions of the second conductor lines. The coil pattern laminated sheet member includes a coiled circuit pattern which is formed by the first conductor line pattern and the second conductor line pattern.

FIG. 5 illustrates a plan view of the coil pattern laminated sheet member 300 provided by the fourth step of the process of the invention. In the figure, reference numeral 300 generally denotes the coil pattern laminated sheet member provided by the fourth step.

In this embodiment, the coil pattern laminated sheet member 300 may be prepared by removing a part of the insulator sheet which corresponds to the upper portions 212a, 214a, 216a and 222a, 224a, 226a and the lower portions 212b, 214b, 216b and 222b, 224b, 226b of all the first and second conductor lines to thereby form upper and lower exposed portions in all the first and second conductor lines, folding the first and second conductor line pattern sheet members 200 so that the insulator sheets 110 face each other, and electrically connecting the exposed portions of the first and second conductor lines with each other so that the first and second conductor line patterns 210, 220 form the coiled circuit pattern 310, as illustrated in FIG. 5. The exposed portions will be described in more detail hereinafter with explanation for several examples for the electrical connection of the fourth step.

The fourth step will be described below in greater details with reference to FIGS. 4A, 4B and 5.

As illustrated in FIG. 5, the upper and lower portions of the first and second conductor line patterns 210, 220 have to be correctly aligned so as to form the coiled circuit pattern 310 by the electrical connection between the upper and lower portions of the first and second conductor lines 212, 214, 216 and 222, 224, 226. In this regard, when the first and second conductor line patterns 210, 220 are aligned in the way in which the lower portion of the nth conductor line of the first conductor line pattern 210 is connected to the upper portion of the nth conductor line of the second conductor line pattern 220, and the upper portion of the (n+1)th conductor line of the first conductor line pattern 210 is connected to the lower exposed portion of the nth conductor line of the second conductor line pattern 220, they are made to form the coiled circuit pattern 310. Also the first and second conductor line terminals 210c, 220c are made to be located respectively at the right and left ends of the coil pattern laminated sheet member 300, that is, the coiled circuit pattern 310. Therefore, when electric current is applied to the first conductor line terminal 210c of the coiled circuit pattern 310, the current will flow through the first parallel conductor lines 212, 214, 216 and the second parallel conductor lines 222, 224, 226 alternatively in a zigzag pattern to the second conductor line terminal 220c, which is not shown in the figures.

The above alignment of the first and second parallel conductor lines may be easily achieved by aligning the marking holes 240 of the first and second conductor line pattern sheet members 200 when they are folded with their insulator sheet 110 facing each other, because the inclination angle, width and interdistance of the conductor lines are adjusted in that way, as described above. Insulated sides of the first and second conductor line pattern sheet members face each other. The insulated sides are ones having non-conductor line patterns.

It could be well known to skilled persons in the art that a plurality of the coil pattern laminated sheet members 300 could be longitudinally connected in series by electrical connection between the conductor line terminals 210c, 220c in the coiled circuit pattern 310, namely, that the coil pattern laminated sheet member 300 could be lengthened as required, depending on the desired number of turns of coil windings.

(The first example for the electrical connection)

Figure 6A:
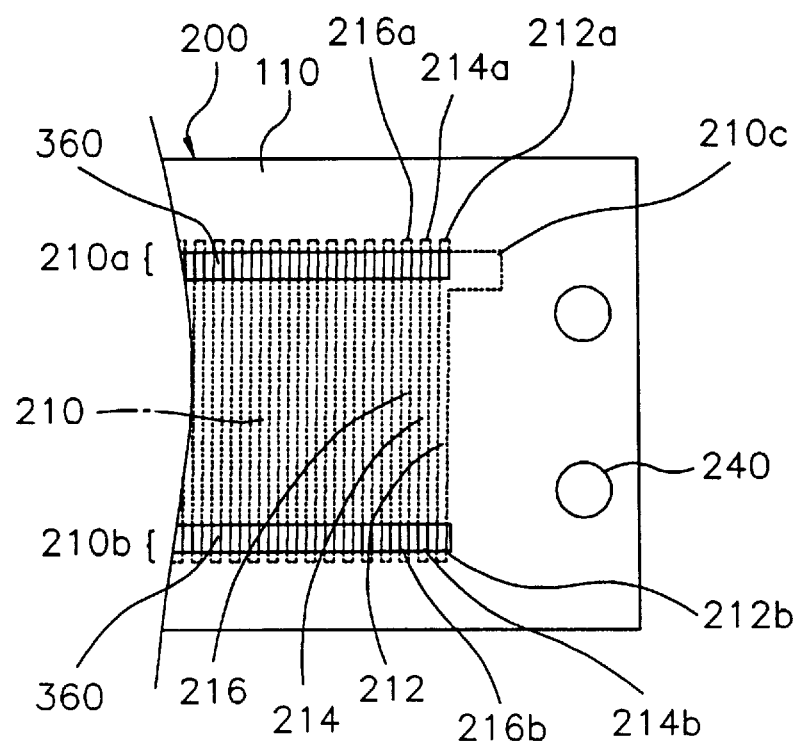
FIG. 6A is a plan view showing the first example for the fourth step of the invention.

FIG. 6A is a plan view illustrating the first example for carrying out the electrical connection of the upper and lower portions of the first and second conductor lines in the fourth step of the invention for preparing the coil pattern laminated sheet member.

According to the first example of FIG. 6A, the first and second conductor line pattern 210, 220 are provided with exposed portions 360 at the upper and lower portions of the individual conductor lines by removing longitudinally a part of the insulator sheet 110 across the upper portions 210a, 220a and lower portions 210b, 220b of the conductor line patterns 210, 220. Thereafter, the coil pattern laminated sheet member 300 may be prepared, as illustrated in FIG. 5, by folding the first and second conductor line pattern sheet members 200 so that the first and second conductor line patterns 210, 220 form the coiled circuit pattern 310, and electrically connecting the upper and lower exposed portions 360 of the first and second conductor lines with each other.

The exposed portions 360 may be formed by selectively etching polyimide or polyester of the insulator sheets 110, as in conventional photolithographic procedures.

Figure 6B:
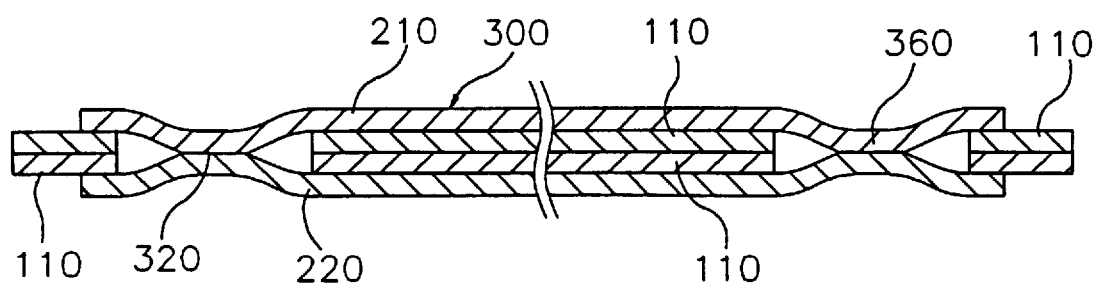
FIG. 6B is a transverse sectional view of a coil pattern laminated sheet member according to the first example of FIG. 6A.

FIG. 6B illustrates the transverse section of the coil pattern laminated sheet member 300 according to the first example of FIG. 6A.

As illustrated in FIG. 6B, the electrical connection of the conductor line patterns 210, 220 may be carried out by applying a solder 320 to the upper and the lower exposed portions 360 of the conductor lines, aligning the conductor line patterns 210, 220 so as to form the coiled circuit pattern 310 as described above, and finally hot-pressing appropriately the upper and lower portions of the first and second conductor line patterns 210, 220 for soldering the solder-applied exposed portions 360. The hot-pressing is carried out here for electrical connections of all the conductor lines all at once.

Preferably, various methods may be employed for applying the solder 320 to the desired place, for instance, solder-plating the upper and lower exposed portions 360 of the conductor lines, or dipping them into a molten solder bath, or printing a solder cream or paste on the upper and lower exposed portions 360 of the parallel conductor lines. It is preferable that the hot-pressing is carried out at a temperature of from about 200 to about 280 degrees Celsius. Below that temperature range results in a defective soldered joint and/or poor bonding strength, consequently leading to a failure of the soldered joint in service. Above that temperature range is also unpreferable because it causes the solder materials to evaporate during the hot-pressing.

(The second example for the electrical connection)

Figure 7A:
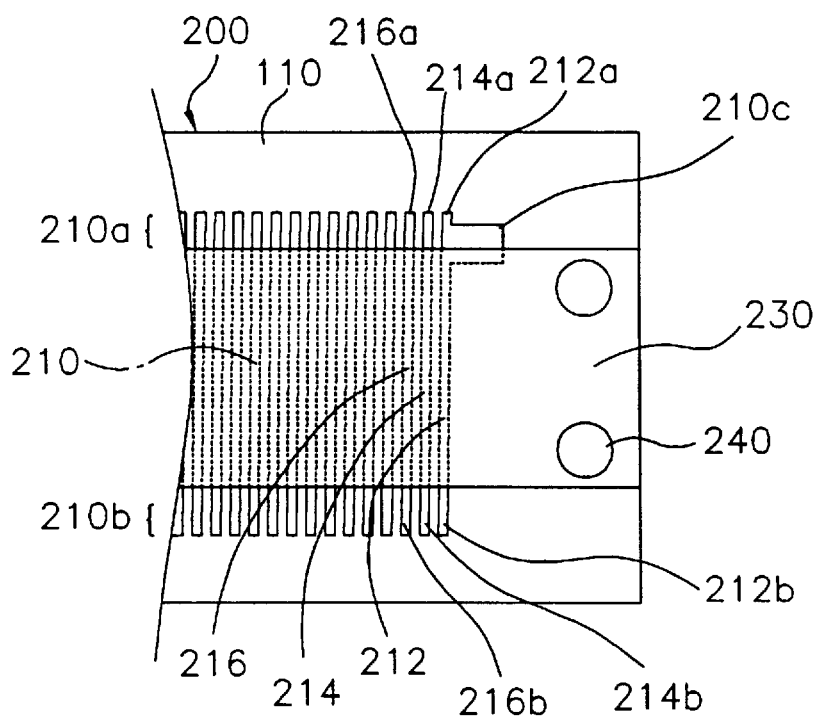
FIG. 7A is a plan view showing the second example for the fourth step of the invention.
Figure 7B:
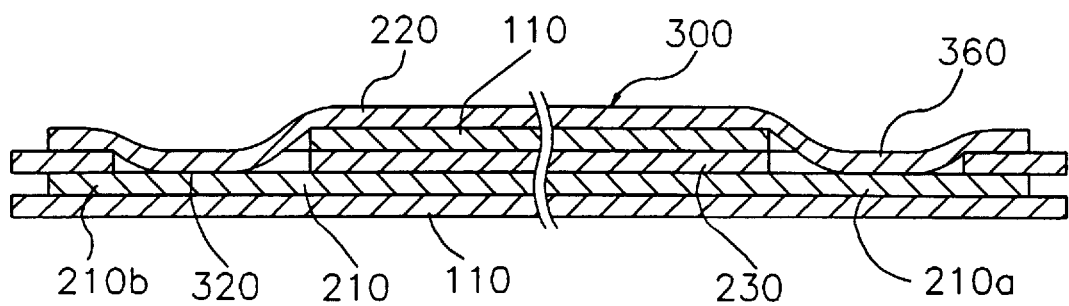
FIG. 7B is a transverse sectional view of a coil pattern laminated sheet member according to the second example of FIG. 7A.

FIGS. 7A and 7B illustrate the second example for carrying out the electrical connection of the upper and lower portions of the first and second conductor lines in the fourth step of the invention for preparing the coil pattern laminated sheet member.

In this example, one of the conductor line pattern sheet members, for example, the second conductor line pattern sheet member 200 is provided with the exposed portions 360 by removing a part of the insulator sheet 110, as illustrated in FIG. 6A. And as for other conductor line pattern sheet member, that is, the first conductor line pattern sheet member 200, an insulating strip 230 is longitudinally adhered across the center portion of the first conductor line pattern 210 except for the upper and lower portions thereof, as illustrated in FIG. 7A. Thereafter, by using a similar process as in the previous example, the exposed portions 360 of the second conductor lines may be electrically connected with the upper and lower portions of the first conductor lines, which are exposed by the insulating strip 230, as illustrated in FIG. 7B.

Besides the first and second examples, there are provided two other examples, for which a description will follow that of the fifth step of the process of the invention just below.

<The fifth step of the process of the invention>

The fifth step of the process of the invention will be described in details below.

Figure 11:
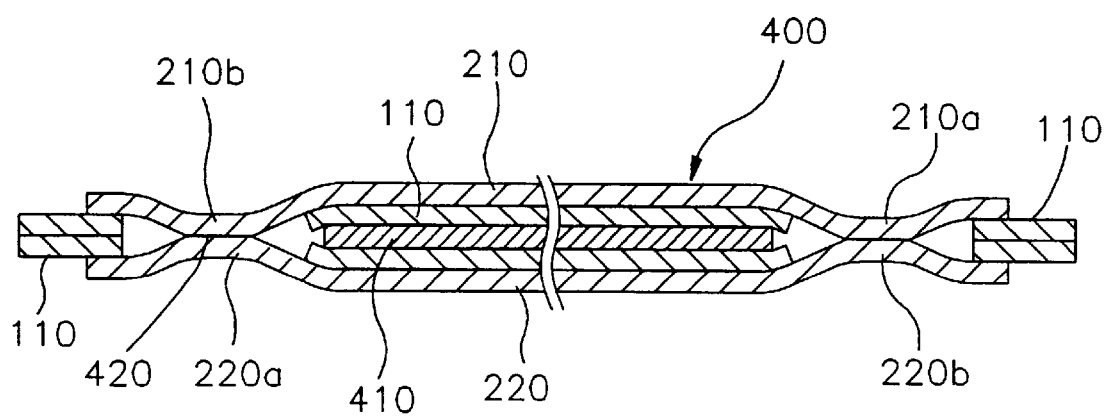
FIG. 11 is a transverse sectional view showing the configuration of a flexible coil winding structure according to the invention.

In the fifth step of the process, a flexible coil winding structure is completed by inserting a magnetizable core into the coil pattern laminated sheet member. FIG. 11 illustrates the transverse cross-section of the completed flexible coil winding structure, which is denoted by reference numeral 400.

As illustrated in the FIG. 6B or 7B, the coil pattern laminated sheet member 300, which is manufactured through the above several steps of the process, comes to include a longitudinal flexible slit formed by and between the two insulator sheets 110, or the insulator sheet 110 and the insulating strip 230. The flexible coil winding structure 400 of FIG. 11 is obtained by inserting the magnetizable core 410 into the longitudinal flexible slit.

Preferably, the magnetizable core has a shape of an elongated strip, for example, like amorphous magnetizable ribbons which may be manufactured by conventional melt spinning technique, etc. It is preferable that the magnetizable core 410 is made from Fe-base or Co-base amorphous magnetic alloys, and has a thickness of from 10 to 25 microns. This embodiment employs Matglass(a registered trademark of Allied Signal in U.S.) having a thickness of about 17 microns.

In respect of carrying out the electrical connection of the upper and lower portions of the first and second conductor line patterns, two other examples besides the previous ones will be described in details below.

(The third example for the electrical connection)

FIGS. 8A to 8D are cross-sectional views taken on line A—A of FIG. 5, illustrating sequentially the third example for carrying out the electrical connection of the upper and lower portions of the first and second conductor lines in the fourth step of the invention for preparing the coil pattern laminated sheet member.

Figure 8A:
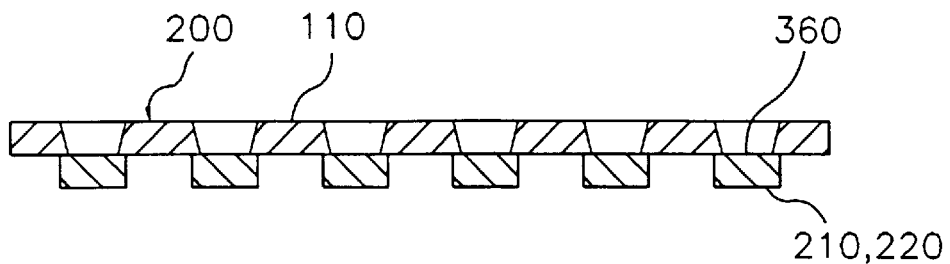
FIGS. 8 to 8D are cross-sectional views taken on line A—A of FIG. 5, showing sequentially the third example for the fourth step of the invention.

As illustrated in FIG. 8A, this example may be carried out by etching partly portions of the insulator sheet 110 which correspond to the upper portions 212a, 214a, 216a and 222a, 224a, 226a and lower portions 212b, 214b, 216b and 222b, 224b, 226b of the first and second conductor lines to form etched holes, thereby providing the upper and lower exposed portions 360. Thereafter, the coil pattern laminated sheet member 300 may be provided by folding the first and second conductor line pattern members 200 so that the first and second conductor line patterns 210, 220 form the coiled circuit pattern 310, and electrically connecting the upper and lower exposed portions 360 of the first and second conductor lines.

The etched holes may be formed by using a similar process as in the example of FIG. 6A.

Figure 8B:
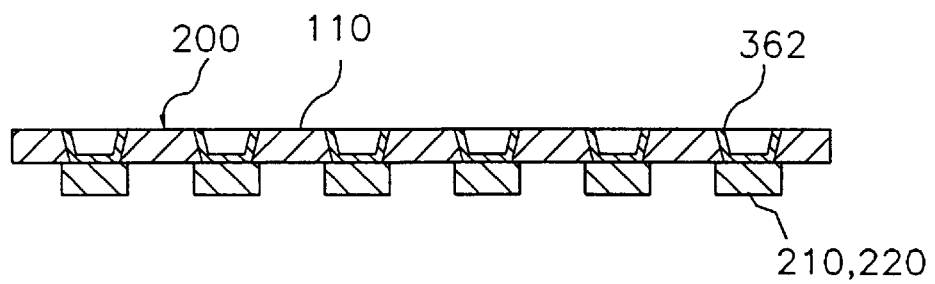
Figure 8C:
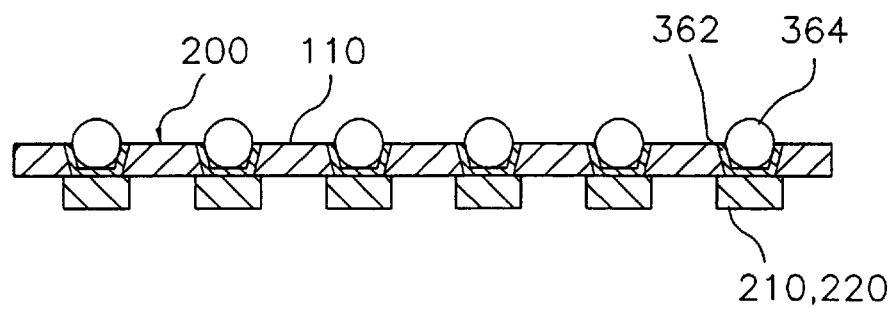
Figure 8D:
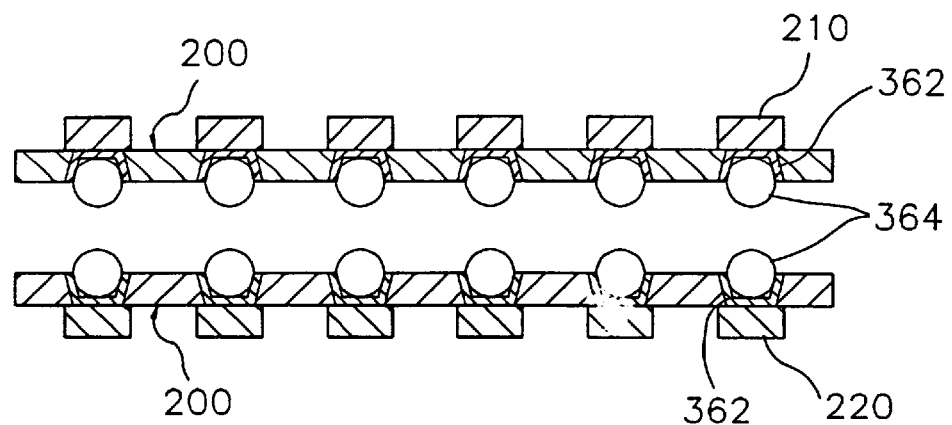

In the third example, the sequential steps for the electrical connection are illustrated in FIGS. 8B to 8D. Namely, as illustrated in FIG. 8B, a metallic film 362 of a thickness of 1 to 2 microns is formed inside the etched holes by employing the exposed portions 360 as a seed layer. After that, as illustrated in FIG. 8C, a solder ball 364 is placed in the exposed portions 360 by using a Solder Ball Array technique, in which the solder balls 364 remain in semi-contact with the metallic film 362. Thereafter, the coil pattern laminated sheet member 300 may be prepared by aligning the conductor line patterns 210, 220 as illustrated in FIG. D, and hot-pressing appropriately the upper and lower portions of the conductor line patterns 210, 220 for soldering the upper and lower portions of the first and second conductor lines by the solder balls 364.

The formation of the metallic film 362 may be carried out by RF sputtering, electroplating or vapor-deposition techniques, etc. The metallic film 362 may be formed by using a metallic material such as copper or lead, which has a good adhesiveness to the solder balls as well as the copper or aluminum of the conductor lines.

Similarly as in the previous example, it is preferable that the hot-pressing is carried out at a temperature of from about 200 to about 280 degrees Celsius.

Figure 9:
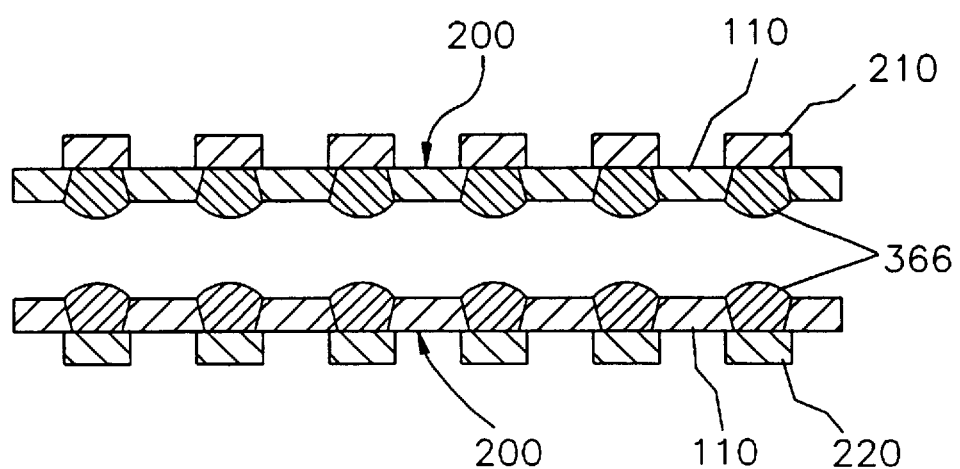
FIG. 9 is a cross-sectional view taken on line A—A of FIG. 5, showing another electrical connection practice in the third example FIGS. 8A to 8D.

With regard to the electrical connection, another method may be employed, as illustrated in FIG. 9. The method may be carried out by forming a metallic build-up layer 366 in the exposed portions 360 up to 10 to 20 microns above the insulator sheet 110, and electrically connecting the metallic build-up layers 366 with each other by using ultrasonic welding technique, etc. Alternatively, the electrical connection may be carried out by coating a solder on the build-up layer 366 followed by hot-pressing, as in the example of FIGS. 6A and 6B.

As for the build-up layers 366, a metallic material such as copper or lead may by employed, which is appropriate for the ultrasonic welding, or hot-pressing.

This example may be also carried out similarly to the previous example of FIGS. 7A and 7B. Namely, one of the conductor line pattern sheet members 200 is provided with the etch holes to place the solder balls 363 or form the build-up layer 366 therein, as in this example. Also the other conductor line pattern sheet member 200 is provided with the upper and lower portions 210a, 210b exposed by the insulating strip 230, as illustrated in FIG. 7A. Thereafter, the electrical connection may be carried out according to a similar practice as illustrated in FIG. 7B.

(The fourth example for the electrical connection)

Figure 10A:
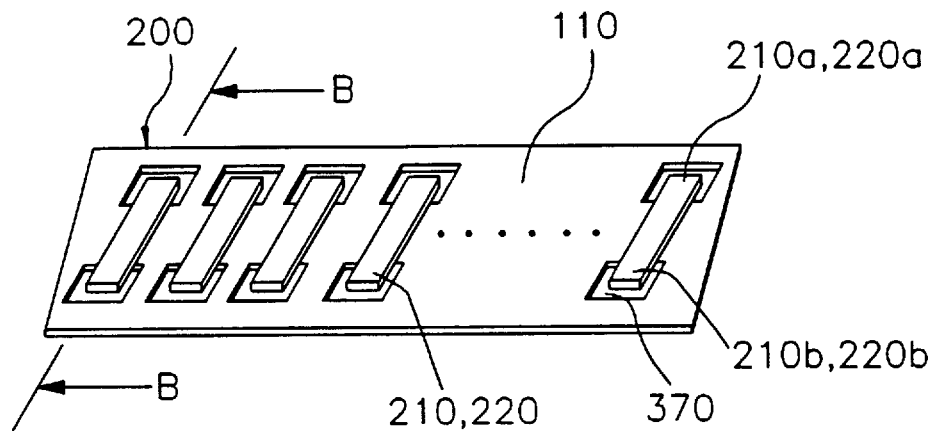
FIGS. 10A to 10C are perspective or cross-sectional views showing sequentially the fourth example for the fourth step of the invention
Figure 10B:
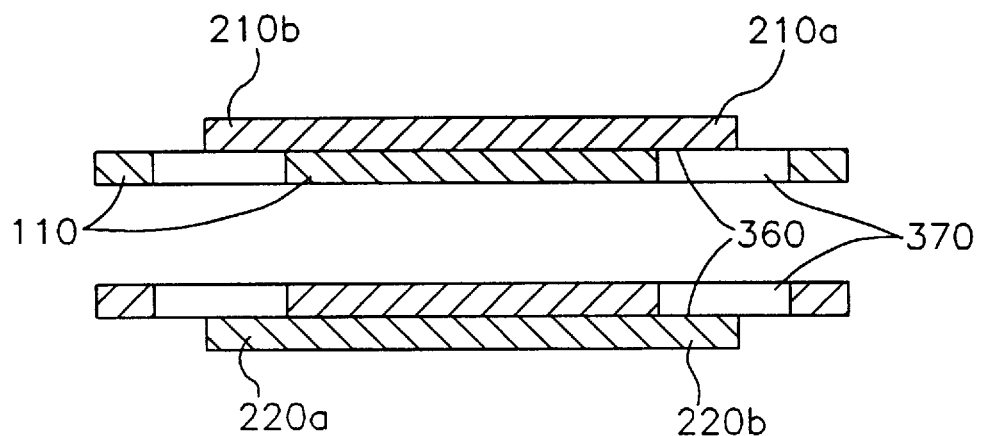
Figure 10C:
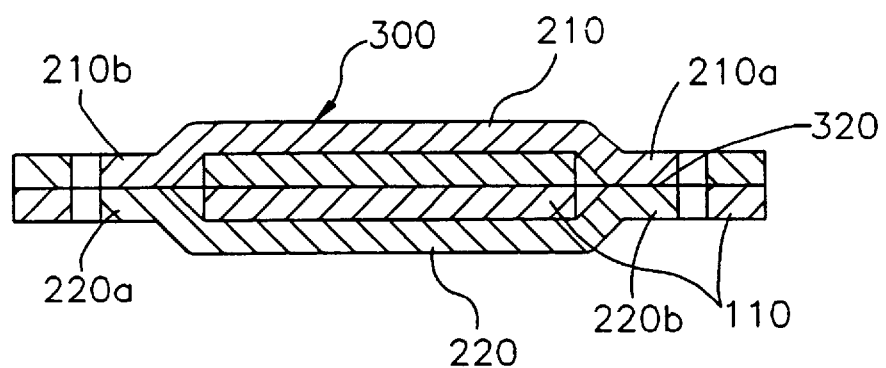

FIGS. 10A to 10C are schematic views illustrating the fourth example for carrying out the electrical connection of the upper and lower portions of the first and second conductor lines in the fourth step of the invention for preparing the coil pattern laminated sheet member.

As illustrated in FIG. 10A, this example may be carried out by removing a part of the insulator sheet 110 which corresponds to the upper ends and lower ends of the individual conductor lines to form a window 370 at the upper and lower ends of the individual conductor lines, in which the upper and lower ends of all the conductor lines, that is, the upper and lower exposed portions 360 are exposed like a lead frame. The coil pattern laminated sheet member 300 may be prepared by folding the first and second conductor line pattern sheet members 200 so that the first and second conductor line patterns 210, 220 form the coiled circuit pattern 310 as illustrated in FIG. 10B, and then electrically connecting appropriately the upper and lower exposed portions 360 as illustrated in FIG. 10C.

The electrical connection may be carried out by ultrasonic-welding the exposed portions 360, or by coating a solder on the exposed portions 360 followed by hot-pressing the solder-coated portions.

This example may be carried out similarly to the previous example of FIGS. 7A and 7B. Namely, one of the conductor line pattern sheet members 200 is provided with the window 370 to form the exposed portions like a lead-frame, as in this example. And the other conductor line pattern sheet member 200 is provided with the upper and lower portions 210a, 210b exposed by the insulating strip 230, as illustrated in FIG. 7A. Thereafter, the electrical connection may be carried out according to a similar practice as illustrated in FIG. 7B.

FIG. 11 illustrates the transverse cross-section of the flexible coil winding structure, which may be manufactured by the above-described process of the invention. As described above and also shown in the figure, the flexible coil winding structure 400 includes at the center portion the magnetizable core 410 having a shape of an elongated strip, the flexible insulator sheets 110 at both sides of the magnetizable core for insulating it, and the first and second conductor line patterns 210, 220 arranged so that the conductor lines can provide the coiled circuit pattern 310 around the pair of flexible insulator sheets 110, as illustrated in FIG. 5. Also, the coil winding structure 400 includes an opening (like the etched holes or the windows, etc.) at a portion of the insulator sheet 110 which corresponds to the upper and lower portions of all the conductor lines of the first and second conductor line patterns 210, 220, and an electrical connection 420 for connecting through the opening the upper portions 210a, 220a and the lower portions 210b, 220b of the first and second conductor line patterns 210, 220 so that the conductor lines provide the coiled circuit pattern 310. The electrical connection 420 may be provided according to various examples of the process as described in this specification.

Any persons skilled in the art will understand that the coil winding structure 400 may be provided with an insulating means for protecting the outermost first and second conductor line patterns 210, 220 from their surroundings as it is employed in various electronic appliances.

While the present invention has been particularly shown and described with reference to preferred embodiments thereof, it will be understood by those skilled in the art that various changes in form and details may be effected therein without departing from the spirit and scope of the invention as defined by the appended claims.

What is claimed is:

1. A process for manufacturing a flyback transformer having a flexible coil winding structure comprising the steps of:
    a) forming a thin conductive layer on each of a pair of thin insulator sheets to obtain a first and second flexible laminated sheet members;
    b) removing partly the conductive layer from the first flexible laminated sheet member to obtain a first conductor line pattern sheet member including a first conductor line pattern, the first conductor line pattern having a plurality of first parallel conductor lines which are inclined at a predetermined angle;
    c) removing partly the conductive layer from the second flexible laminated sheet member to obtain a second conductor line pattern sheet member including a second conductor line pattern, the second conductor line pattern having a plurality of second parallel conductor lines which are inclined at the same angle as in the first conductor line pattern;
    d) facing insulated sides of the first and second flexible laminated sheet members to each other, connecting the upper portions and the lower portions of the first conductor lines with the lower portions and upper portions of the second conductor lines all at once through hot-pressing of the first and second flexible laminated sheet members to obtain a coil pattern laminated sheet member including a coiled circuit pattern, whereby the coiled circuit pattern is formed by the first conductor line pattern and the second conductor line pattern, the insulated sides of the first and second flexible laminated sheet members being ones having non-conductor line patterns; and
    e) inserting a magnetizable core into the coil pattern laminated sheet member.

2. The process of claim 1 wherein the insulator sheet has a thickness of less than about 35 microns.

3. The process of claim 1 wherein the insulator sheet is made from a material selected from the group consisting of polyimide and polyester.

4. The process of claim 1 wherein the conductive layer has a thickness of from several to about 100 microns, preferably of from about 25 to about 75 microns.

5. The process of claim 1 wherein the conductive layer is made from a material selected from the group consisting of copper and aluminum.

6. The process of claim 1 wherein the forming step of a) comprises applying an adhesive to the surface of the insulator sheet followed by adhering a copper film over the adhesive.

7. The process of claim 1 wherein the forming step of a) comprises applying an adhesive to the surface of the insulator sheet followed by adhering an aluminum film over the adhesive.

8. The process of claim 1 wherein the forming step of a) comprises forming a seed layer of a conductive material on the insulator sheet followed by forming the conductive layer over the seed layer.

9. The process of claim 8 wherein the seed layer is formed by RF sputtering.

10. The process of claim 8 wherein the conductive material of the seed layer is selected from the group consisting of chromium and nickel.

11. The process of claim 1 wherein the first and second conductor line patterns include a conductor line terminal respectively, and the conductor line terminals are integrally formed with either the right end conductor line or the left end conductor line.

12. The process of claim 1 wherein the first and second conductor line pattern sheet members include an align mark for correctly arranging the upper and lower portions of the first and second parallel conductor lines in the connecting step of d).

13. The process of claim 12 wherein the conductor line pattern sheet members are conductor line pattern sheet members having a pair of holes at either the longitudinal right or left end margin, or at both end margins, and the holes are employed as the align mark.

14. The process of claim 12 wherein the conductor line pattern sheet members are conductor line pattern sheet members having a plurality of holes in the transverse upper and lower end margins, and the holes are employed as the align mark.

15. The process of claim 1 wherein the connecting step of d) comprises the steps of removing a part of the insulator sheet which corresponds to the upper and lower portions of all the first conductor lines to thereby form upper and lower exposed portions in all the first conductor lines, insulating the center portion of the second conductor lines except for the upper and lower portions of them, folding the first and second conductor line pattern sheet members so that the upper and lower exposed portions of the first conductor lines face respectively to the lower and upper portions of the second conductor lines, and electrically connecting the exposed portions of the first conductor lines and the upper and lower portions of the second conductor lines with each other so that the first and second conductor line patterns form the coiled circuit pattern.

16. The process of claim 1 wherein the connecting step of d) comprises the steps of removing a part of the insulator sheet which corresponds to the upper and lower portions of all the first and second conductor lines to thereby form upper and lower exposed portions in all the first and second conductor lines, folding the first and second conductor line pattern sheet members so that the insulator sheets face each other, and electrically connecting the exposed portions of the first and second conductor lines with each other so that the first and second conductor line patterns form the coiled circuit pattern.

17. The process of claim 16 wherein the step of removing a part of the insulator sheet is carried out by removing longitudinally a part of the insulator sheet across the upper and lower portions of the conductor lines to thereby form the exposed portions.

18. The process of claim 17 wherein the step of electrically connecting includes the steps of applying a solder to the exposed portions of the first and second conductor lines, and hot-pressing for soldering the exposed portions of the conductor lines.

19. The process of claim 18 wherein the step of applying the solder is carried out by solder-plating the exposed portions of the first and second conductor lines.

20. The process of claim 18 wherein the step of applying the solder is carried out by dipping the exposed portions of the first and second conductor lines into a molten solder.

21. The process of claim 18 wherein the step of applying the solder is carried out by printing a solder cream on the exposed portions of the first and second conductor lines.

22. The process of claim 18 wherein the step of hot-pressing is carried out at a temperature of from about 200 to about 280 degrees Celsius.

23. The process of claim 16 wherein the step of removing a part of the insulator sheet is carried out by etching a part of the insulator sheet which corresponds to the upper and lower portions of the individual conductor lines to thereby form the exposed portions.

24. The process of claim 23 wherein the step of electrically connecting comprises the steps of forming on the exposed portions a metallic film of a thickness of 1 to 2 microns, placing solder balls on the exposed portions using a solder ball grid array technique, and hot-pressing for soldering the exposed portions of the conductor lines.

25. The process of claim 24 wherein the metallic film is formed by electroplating.

26. The process of claim 24 wherein the metallic film is formed by RF sputtering.

27. The process of claim 24 wherein the metallic film is formed by vapor-deposition.

28. The process of claim 24 wherein the metallic film is made from any one selected from the group consisting of copper and lead.

29. The process of claim 24 wherein the hot-pressing is carried out at a temperature of from about 200 to about 280 degrees Celsius.

30. The process of claim 23 wherein the step of electrically connecting comprises the steps of forming on the exposed portions a metallic build-up layer up to 10 to 20 microns above the surface of the insulator sheet, and electrically connecting the metallic build-up layers with each other.

31. The process of claim 30 wherein the step of electrically connecting includes the steps of applying a solder to the metallic build-up layers, and hot-pressing for soldering the metallic build-up layers.

32. The process of claim 31 wherein the step of applying the solder is carried out by solder-plating the metallic build-up layers.

33. The process of claim 31 wherein the step of applying the solder is carried out by dipping the metallic build-up layers into a molten solder.

34. The process of claim 31 wherein the step of applying the solder is carried out by printing a solder cream on the metallic build-up layers.

35. The process of claim 31 wherein the step of hot-pressing is carried out at a temperature of from about 200 to about 280 degrees Celsius.

36. The process of claim 31 wherein the step of applying the solder is carried out by printing a solder cream on the exposed portion.

37. The process of claim 31 wherein the step of hot-pressing is carried out at a temperature of from about 200 to about 280 degrees Celsius.

38. The process of claim 30 wherein the metallic build-up layers are made from any one selected from the group consisting of copper and lead.

39. The process of claim 16 wherein the step of removing a part of the insulator sheet is carried out by forming a window at a portion of the insulator sheet which corresponds to the upper and lower ends of the individual conductor lines to thereby form the exposed portions, whereby the exposed portions are exposed like a lead frame.

40. The process of claim 39 wherein the step of electrically connecting includes the steps of applying a solder to the exposed portions, and hot-pressing for soldering the exposed portions.

41. The process of claim 40 wherein the step of applying the solder is carried out by solder-plating the exposed portions.

42. The process of claim 42 wherein the step of applying the solder is carried out by dipping the exposed portions into a molten solder.

43. A flyback transformer having a flexible coil winding structure, comprising:
   a) a flexible magnetizable core at a center portion of the winding structure;
   b) a pair of flexible insulator sheets at both sides of the magnetizable core for insulating it; and
   c) a first conductor line pattern and a second conductor line pattern including respectively a plurality of first and second parallel conductor lines which are inclined at a predetermined angle and arranged so that the conductor lines provide a coiled circuit pattern around the pair of flexible insulator sheets, the first conductor line pattern being formed on one of the pair of flexible insulator sheets, and the second conductor line pattern being formed on the other of the pair of flexible insulator sheets, at least one of the pair of flexible insulator sheets having openings for electrical connection of all the conductor lines of the first and second conductor line pattern all at once through hot-pressing so that the first and second conductor line patterns provide the coiled circuit pattern, the openings being formed at a portion of each of the insulator sheets which corresponds to the upper and lower portions of all the conductor lines of the first and second conductor line patterns, insulated sides of the pair of flexible insulator sheets facing to each other, the insulated sides being ones having non-conductor line patterns.

44. The flyback transformer of claim 43 wherein the first and second parallel conductor lines have a thickness of from several to about 100 microns, preferably of from about 25 to about 75 microns.

45. The flyback transformer of claim 43 wherein the coiled circuit pattern includes conductor line terminals integrally formed therewith for inflow and outflow of electric current.

46. The flyback transformer of claim 43 wherein the electrical connection is provided by soldering through hot-pressing the upper and lower portions of the parallel conductor lines.

* * * * *